US012772819B2

(12) United States Patent
Han

(10) Patent No.: US 12,772,819 B2
(45) Date of Patent: Oct. 20, 2026

(54) INTERCONNECT DEVICE AND METHOD

(71) Applicant: Intel Corporation, Santa Clara, CA (US)

(72) Inventor: Jung Kyu Han, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 41 days.

(21) Appl. No.: 18/089,417

(22) Filed: Dec. 27, 2022

(65) Prior Publication Data

US 2024/0213163 A1 Jun. 27, 2024

(51) Int. Cl.

| | |
|---|---|
| ***H10W 20/20*** | (2026.01) |
| ***H10W 44/20*** | (2026.01) |
| ***H10W 46/00*** | (2026.01) |
| ***H10W 70/60*** | (2026.01) |
| ***H10W 70/65*** | (2026.01) |
| ***H10W 90/00*** | (2026.01) |
| *H10W 72/00* | (2026.01) |
| *H10W 72/20* | (2026.01) |

(52) U.S. Cl.

CPC ........... *H10W 20/20* (2026.01); *H10W 44/20* (2026.01); *H10W 46/00* (2026.01); *H10W 70/611* (2026.01); *H10W 70/65* (2026.01); *H10W 90/00* (2026.01); *H10W 72/07255* (2026.01); *H10W 72/251* (2026.01); *H10W 90/734* (2026.01)

(58) Field of Classification Search

CPC ..... H10W 20/20; H10W 44/20; H10W 90/00; H10W 70/65; H10W 46/00

See application file for complete search history.

(56) References Cited

U.S. PATENT DOCUMENTS

| | | | | |
|---|---|---|---|---|
| 10,163,798 | B1 * | 12/2018 | Alur | H10W 70/05 |
| 2019/0206796 | A1 * | 7/2019 | Hwang | H10W 70/611 |
| 2020/0343049 | A1 * | 10/2020 | Paital | H01G 4/33 |
| 2021/0384130 | A1 * | 12/2021 | Cheah | H10W 70/611 |

* cited by examiner

*Primary Examiner* — Mohammad M Choudhry
(74) *Attorney, Agent, or Firm* — Akona IP PC

(57) ABSTRACT

An electronic device and associated methods are disclosed. In one example, the electronic device includes vertical connections with a layer including tin between the vertical connections and conductive traces. In selected examples, a layer including tin is used in conjunction with other interface layers. In selected examples, a layer including tin is used in all vertical connections.

20 Claims, 6 Drawing Sheets

INTERCONNECT DEVICE AND METHOD

TECHNICAL FIELD

Embodiments described herein generally relate semiconductor devices and associated methods. Specifically, selected examples include metallurgy at interfaces between components such as semiconductor dies and substrate components.

BACKGROUND

In semiconductor manufacturing, different processes have requirements such as chemicals, temperatures, etc. that must be compatible with other processes in order to not damage or change previously formed components. It is desired to have effective processes and resulting formed components that are compatible with each other. Methods and devices described in the present disclosure address these concerns, improve process efficiency, and other technical challenges.

DESCRIPTION OF EMBODIMENTS

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Figure 1:
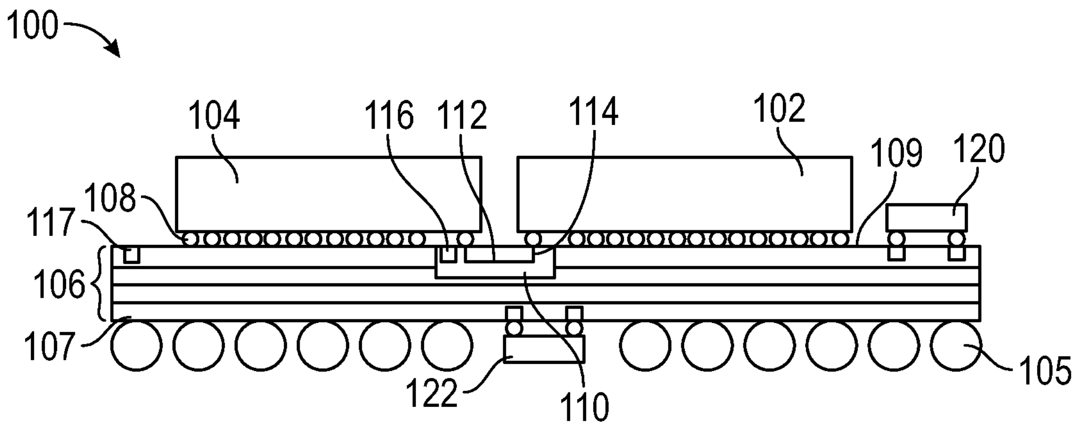
FIG. 1 shows a side view of a semiconductor device in accordance with some example embodiments.

FIG. 1 shows a semiconductor device 100. The semiconductor device 100 includes a first semiconductor die 102, and a second semiconductor die 104. Examples of semiconductor dies 102, 104 include, but are not limited to, processor dies, memory dies, controller dies, etc. The semiconductor dies 102, 104 are shown coupled to a die side top surface 109 of a substrate 106.

The substrate 106 includes a number of layers 107. Layers 107 include dielectric layers, and conductor trace layers. Conductor traces may be interconnected between layers with vertical connections. Other vertical connections are also included at exposed surfaces of the substrate 106, such as the top surface 109, or die side surface and a bottom surface, or land side surface. Vertical connections and traces form electrical pathways between devices such as semiconductor dies 102, 104 and other components of the semiconductor device 100. In one example, an outermost top layer 107 includes a solder resist material, which acts as a dielectric, and is used to form vertical connections as described in more detail below.

An interconnect bridge 110 is shown connected between the semiconductor dies 102, 104. The interconnect bridge 110 includes a number of lateral traces 114 and a number bridge vertical connections 114. In the example of FIG. 1, a bridge fiducial marker 116 is also included. Fiducial markers are included in some examples for use in more precisely locating components relative to each other. For example, the bridge fiducial marker 116 can be compared to a location of a substrate fiducial marker 117 and a position of the interconnect bridge 110 can be fine tuned relative to the substrate 106. In one example, fiducial markers 116, 117 are detected using reflected light. As such, a reflectivity of fiducial markers 116, 117 is important for accurate location of components such as the interconnect bridge 110.

A number of first level solder connections 108 are also shown in FIG. 1. In one example, the solder connections 108 form electrical connections between pads or other structures on the semiconductor dies 102, 104, and vertical connections on the substrate 106. Specific characteristics of vertical connections on the substrate 106 are discussed in more detail below.

One or more capacitors are included in the semiconductor device 100 in selected examples. A die side capacitor 120 and a land side capacitor 122 are shown in the example of FIG. 1. The land side capacitor 122 is shown at a thickness that is thinner than land side solder connections 105. This provides the land side capacitor 122 space when the semiconductor device 100 is coupled to subsequent circuitry, such as a mother board (not shown). Capacitors 122, 124 may be included as part of a power delivery system, and are useful in providing a reliable level of power to semiconductor dies 102, 104.

Vertical connections at an exposed layer (for example, top layer 107 and/or bottom layer 107 of substrate 106) are used for a number of different electrical connections. For example, a first vertical connection may be used for connecting semiconductor dies 102, 104 directly to substrate 106. A second vertical connection may be used in the interconnect bridge 110 to couple between semiconductor dies 102, 104. Third vertical connections may be used to couple to capacitors such as capacitors 122, 124. Fourth vertical connections may be used only as fiducial markers, and may not be electrically connected to other circuitry.

Vertical connections at an external surface of the substrate 106 may utilize an interfacial material layer between exposed traces in the substrate 106 and vertical connections that electrically couple to the traces. The interfacial layer is often utilized to aid in joint reliability between the exposed traces in the substrate 106 and vertical connections. The layer that is used for an interfacial layer may also be used to passivate an exposed surface of a trace, or to provide a suitable reflective surface for a fiducial marker. It is desired to utilize a single process to form layers to reduce cost and simplify manufacturing.

In manufacture, different vertical connections may utilize different processing methods. For example, interconnect bridge vertical connections may be formed by laser drilling. However, laser drilling is time consuming, and may require other processing to remove unwanted dielectric residue in drilled openings as a result of laser heating. Examples of the present disclosure eliminate negative laser drilling effects by instead using a different interface layer chemistry and a different masking process and lithography to form vertical connections. In one example, a dry film resist (DFR) is used to mask selected openings. In one example, a layer including tin is included at an interface between traces in the substrate 106 and vertical connections on an exposed surface of the substrate 106. In one example, autocatalytic tin deposition is utilized, although the invention is not so limited. A tin deposition process is compatible with a dry film resist lithography process to selectively mask openings, which is easier and less expensive to use compared to laser drilling.

Figure 2:
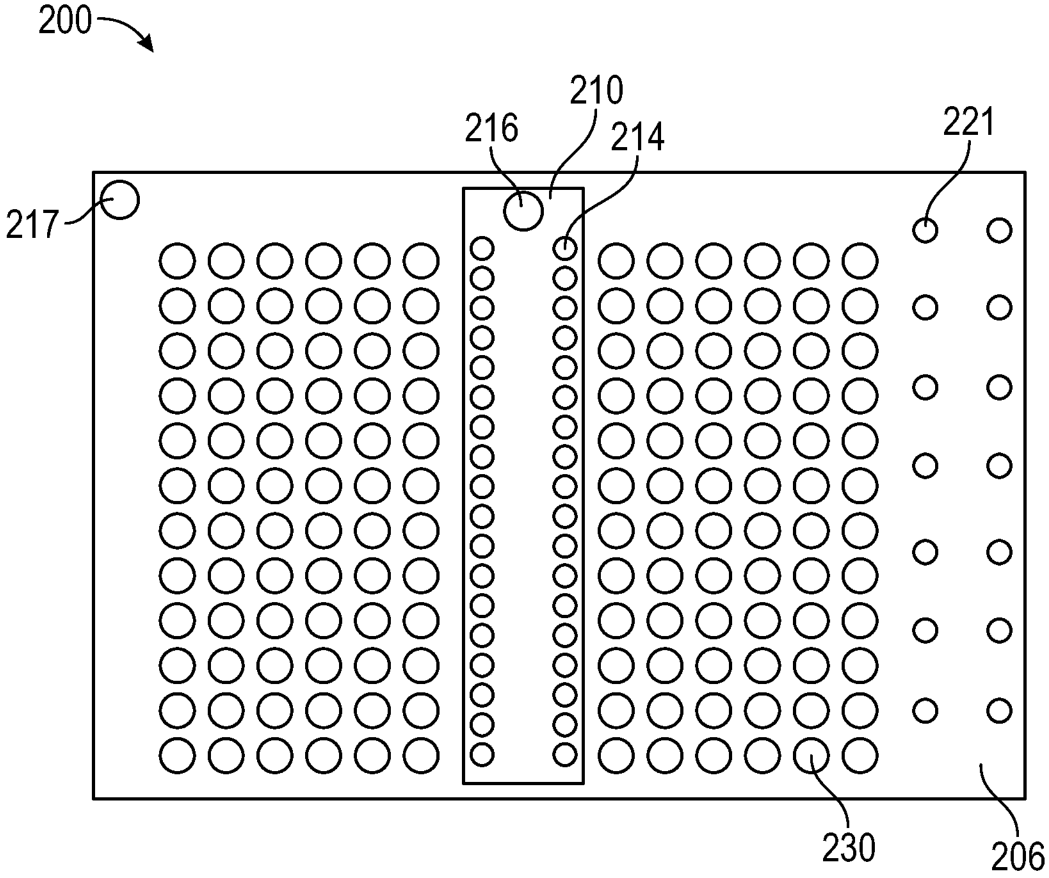
FIG. 2 shows a top view of a substrate for a semiconductor device in accordance with some example embodiments.

FIG. 2 shows as top view of a semiconductor device 200 to better illustrate different vertical connections on exposed surfaces of a substrate as discussed above with respect to FIG. 1. A substrate 206 is shown. A number of first vertical connections 230 are shown that may be subsequently connected directly to semiconductor dies, such as semiconductor dies 102, 104 from FIG. 1. An interconnect bridge 210 is shown. In one example, the interconnect bridge 210 is at least partially embedded within the substrate 206. In one example, the interconnect bridge 210 is embedded within the substrate 206, and a top surface of the interconnect bridge 210 and a top surface of the substrate 206 form a coplanar top surface. This is also illustrated in FIG. 1, where a top surface of the interconnect bridge 110 is coplanar with a top surface of the substrate 106. Although a coplanar top surface is shown in examples, the invention is not so limited. An interconnect bridge may not be embedded in the substrate, or may be only partially embedded.

The interconnect bridge 210 includes a number of second vertical connections 214. The interconnect bridge 210 of FIG. 2 also includes a bridge fiducial maker 216. The substrate 206 of FIG. 2 also includes a substrate fiducial marker 217. The example of FIG. 2 further shows third vertical connections 221 for connection to one or more capacitors. In one example, only selected vertical connections from the different vertical connections (230, 214, 216, 217, 221) include a layer including tin. In one example, all vertical connections from the different vertical connections (230, 214, 216, 217, 221) include a layer including tin.

The layer including tin may be used to cover a lower interfacial layer, and prevent chemical interactions with the lower interfacial layer to prevent cracking and failure of a copper plug used to form a remaining portion of a vertical connection. The layer including tin may be used to form a reflective surface for a fiducial marker. The layer including tin may be used to passivate an exposed surface, and to prepare for subsequent application of solder.

Figure 3A:
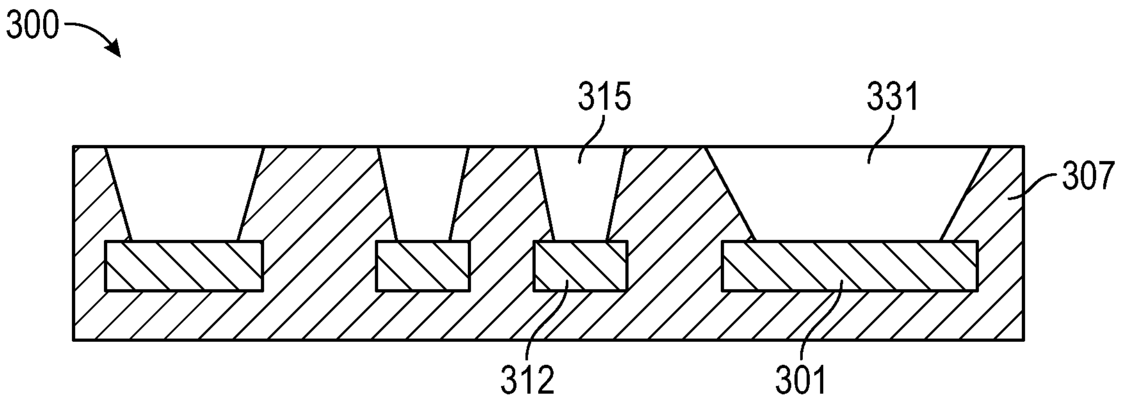
FIG. 3A-3E show cross section process figures of a substrate for a semiconductor device in accordance with some example embodiments.

FIGS. 3A-3E show selected cross section figures in a manufacturing process of a substrate for a semiconductor device. In FIG. 3A, a layer 307 of a substrate 300 is shown. In the example of FIG. 3A, the layer 307 includes a solder resist layer. A number of first openings 331 and a number of second openings 315 are shown within the solder resist layer 307. The openings 331, 315 expose substrate conductive traces 301 and interconnect bridge conductive traces 312.

Figure 3B:
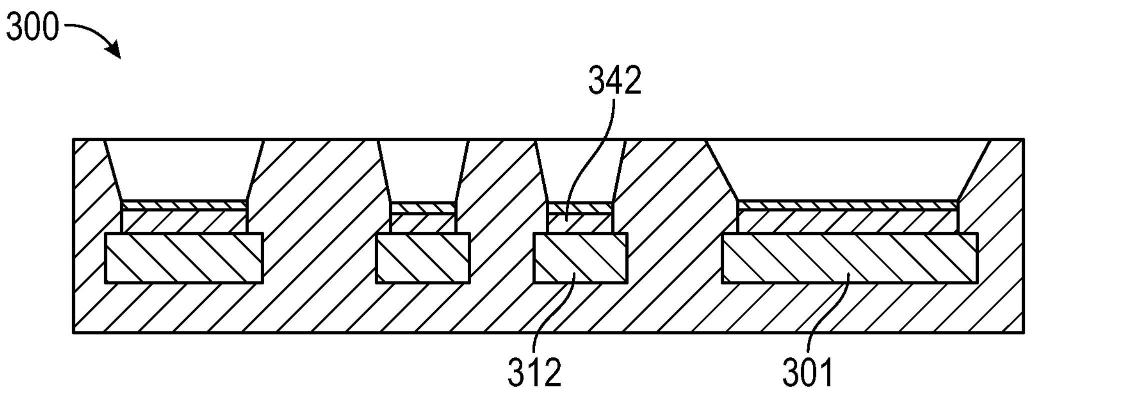

In FIG. 3B, one or more interface layers 342 are deposited over the exposed conductive traces 301, 312. In one example, the one or more interface layers 342 include nickel, palladium and gold. This combination of interface layers may be used to passivate a surface of the exposed conductive traces 301, 312 and to provide improved adhesion and mechanical strength to subsequent solder. However, in one example, plating or otherwise forming a copper vertical interconnect over nickel, palladium and gold leads to unwanted interactions of the copper with nickel that lead to cracking in the interface.

Figure 3C:
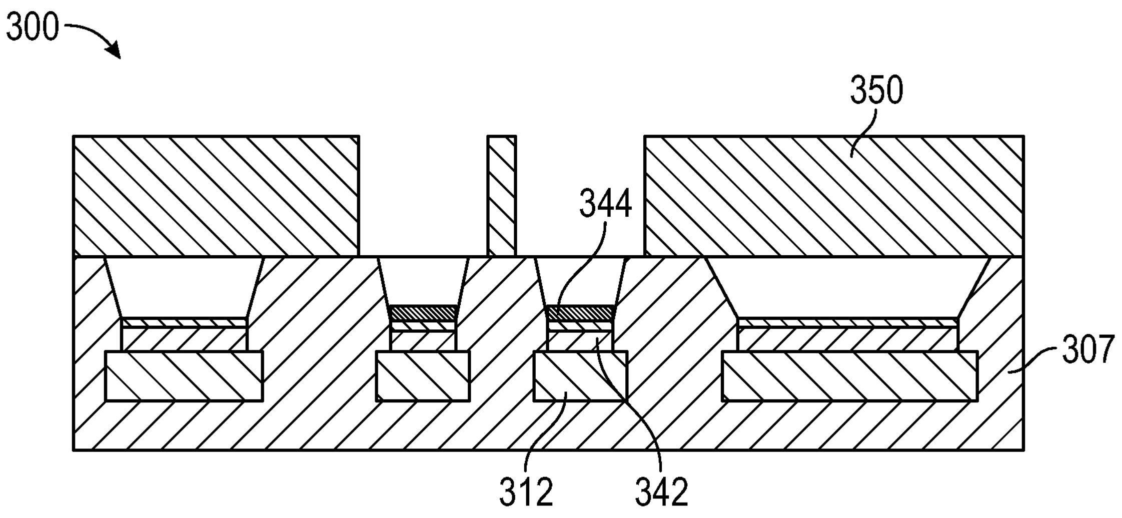

FIG. 3C shows a mask layer 350 to cover the first openings 331 and leave second openings 315 exposed for application of an interface layer including tin. In one example, the mask layer 350 includes a dry film resist (DFR). In FIG. 3C, an interface layers including tin 344 is added over the nickel, palladium and gold interface layers 342. Application of tin is compatible with the dry film resist mask layer 350. In one example, the application of the interface layer including tin 344 includes autocatalytic deposition of tin. The tin 344 covers the nickel, palladium and gold interface layers 342, and prevents unwanted interactions between subsequent copper deposition and nickel.

Figure 3D:
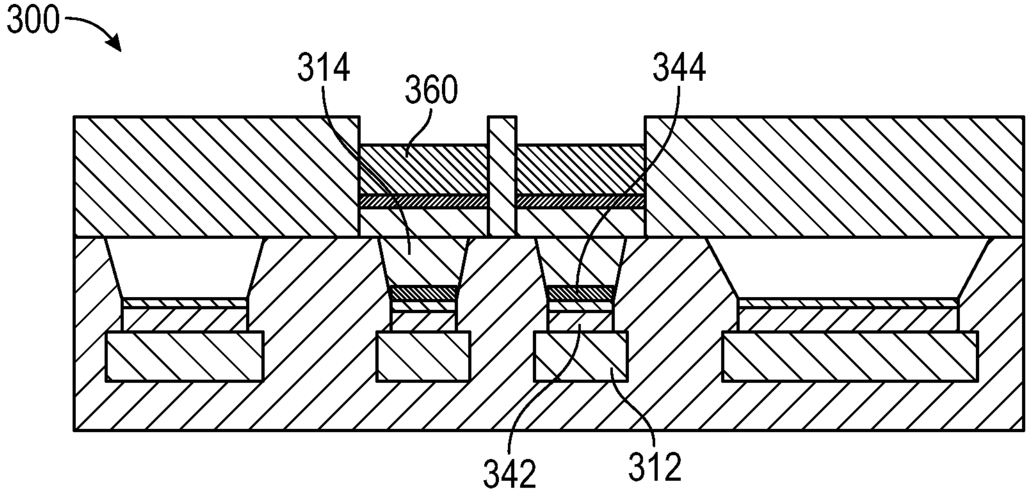
Figure 3E:
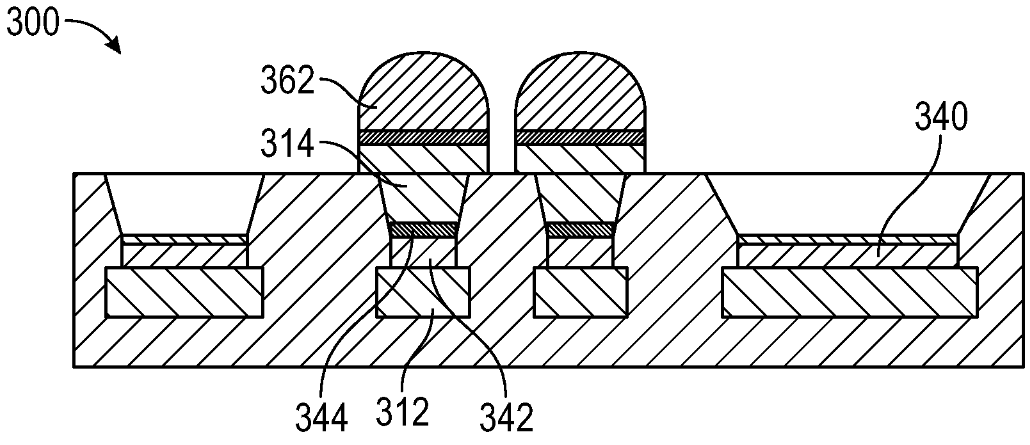

FIG. 3D shows vertical connections 314 formed in the second openings 315 with the interface layer including tin 344 separating the nickel, palladium and gold interface layers 342 from the copper vertical connections 314. A solder layer 360 is further added over the vertical connections 314. In FIG. 3E, the solder layer 360 is reflowed to form a solder bump 362. In one example, solder is also included in the first openings 331, and dies may be attached to the substrate 300. Vertical connections 314 may be used to directly couple two dies through an interconnect bridge. Solder in the first openings forms other vertical connections that directly couple the dies to the substrate 300 for transmission of power or signals through the substrate 300 to additional circuitry such as a mother board.

Figure 4A:
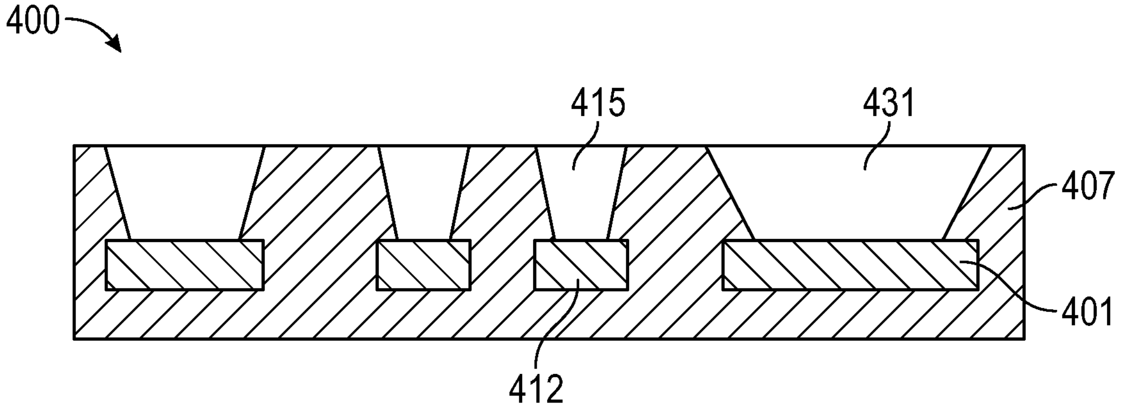
FIG. 4A-4D show cross section process figures of a substrate for a semiconductor device in accordance with some example embodiments.

FIGS. 4A-4D show selected cross section figures in another manufacturing process of a substrate for a semiconductor device. In FIG. 4A, a layer 407 of a substrate 400 is shown. In the example of FIG. 4A, the layer 407 includes a solder resist layer. A number of first openings 431 and a number of second openings 415 are shown within the solder resist layer 407. The openings 431, 415 expose substrate conductive traces 401 and interconnect bridge conductive traces 412.

Figure 4B:
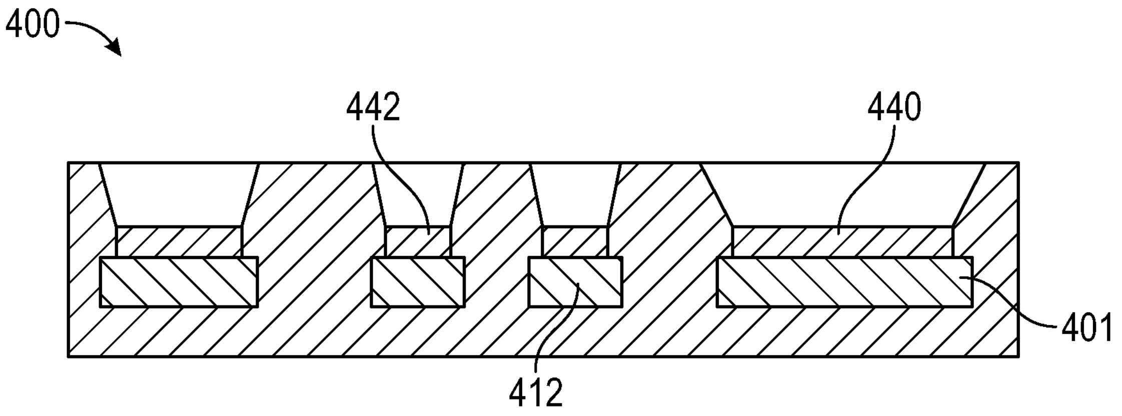

In FIG. 4B, an interface layer including tin 442 is deposited over the exposed conductive traces 401, 412. In one example, the application of the interface layer including tin 244 includes autocatalytic deposition of tin. In the example of FIG. 4B, the interface layer including tin 244 is used to passivate a surface of the exposed conductive traces 401, 412 and to provide improved adhesion and mechanical strength to subsequent solder. In the example of FIG. 4B, the interface layer including tin 244 is used in all vertical connections. In other examples, the interface layer including tin 244 is used in only selected vertical connections.

Figure 4C:
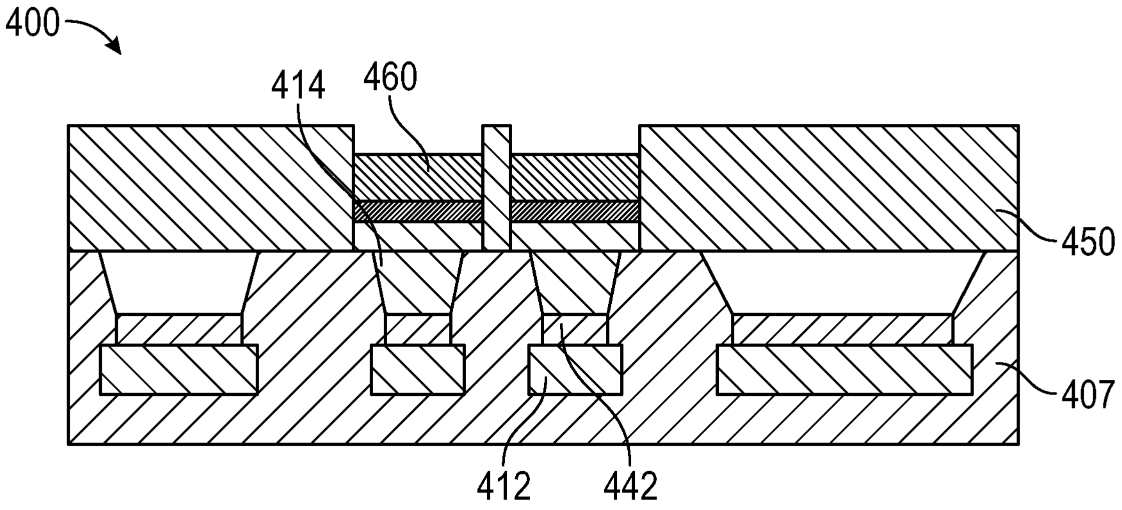

In FIG. 4C, vertical connections 414 formed in the second openings 415 with the interface layer including tin 444 separating the copper vertical connections 414 from the conductive traces 412. Solder layer 460 is further added over the vertical connections 414. A masking layer 450, such as a dry film resist layer, may be used to selectively mask the first openings 431 and only deposit solder 460 in the second openings 415.

Figure 4D:
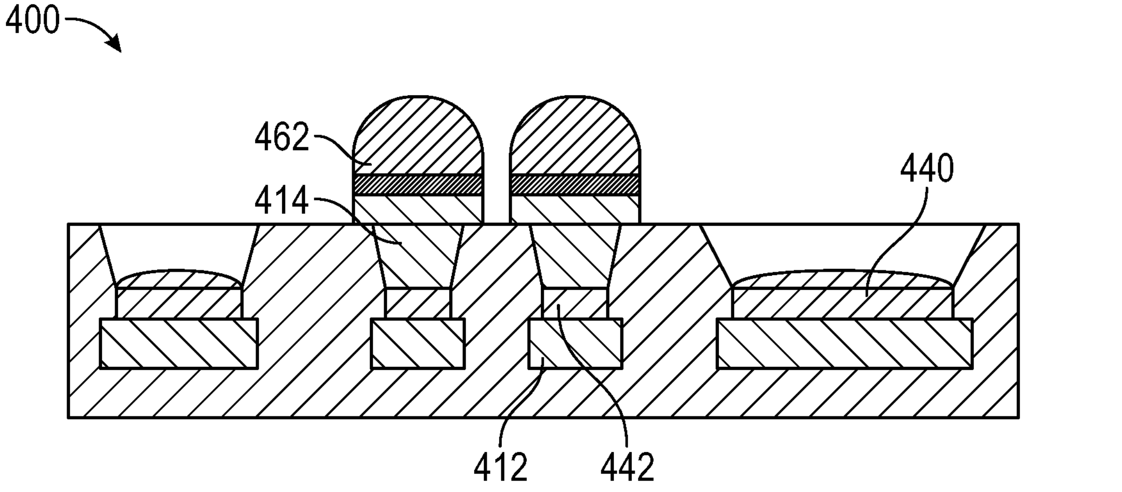

In FIG. 4D, the solder layer 460 is reflowed to form a solder bump 462. In one example, solder is also included in the first openings 431, and dies may be attached to the substrate 400. Vertical connections 414 may be used to directly couple two dies through an interconnect bridge. Solder in the first openings forms other vertical connections that directly couple the dies to the substrate 400 for transmission of power or signals through the substrate 400 to additional circuitry such as a mother board.

Figure 5:
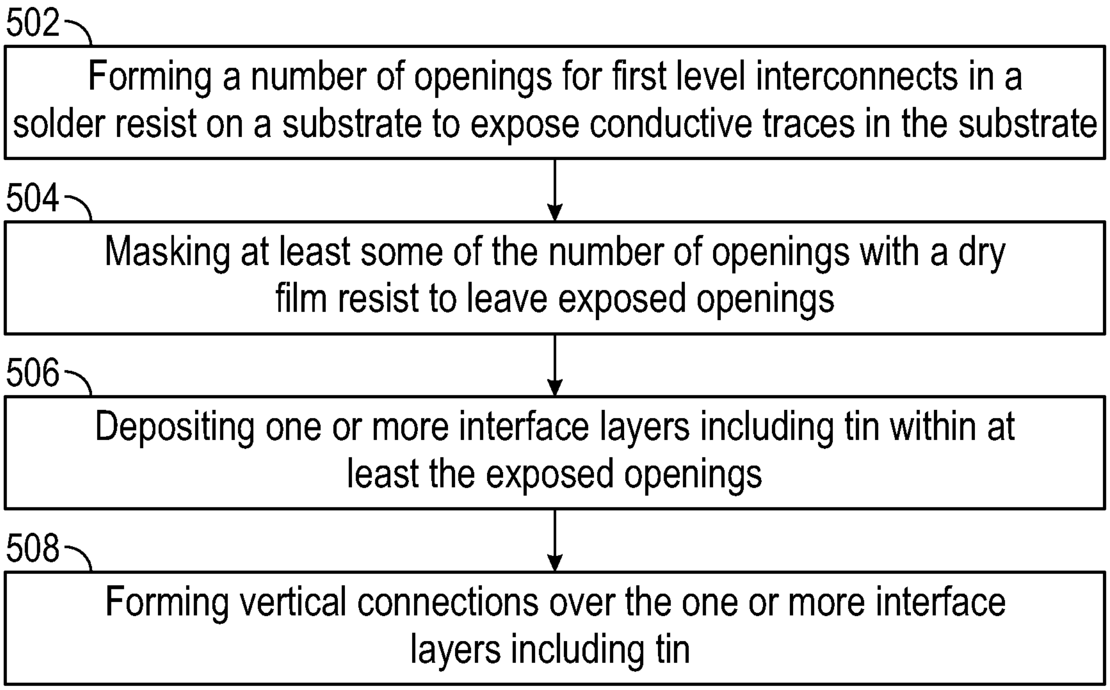
FIG. 5 shows a flow diagram of a method of manufacture of a semiconductor device in accordance with some example embodiments.

FIG. 5 shows a flow diagram of another method of manufacturing a semiconductor device. In operation 502, a number of openings for first level interconnects are formed in a solder resist on a substrate to expose conductive traces in the substrate. In operation 504, at least some of the number of openings are masked with a dry film resist to leave exposed openings. In operation 506, one or more interface layers including tin are deposited within at least the exposed openings, and in operation 508, vertical connections are formed over the one or more interface layers including tin.

Figure 6:
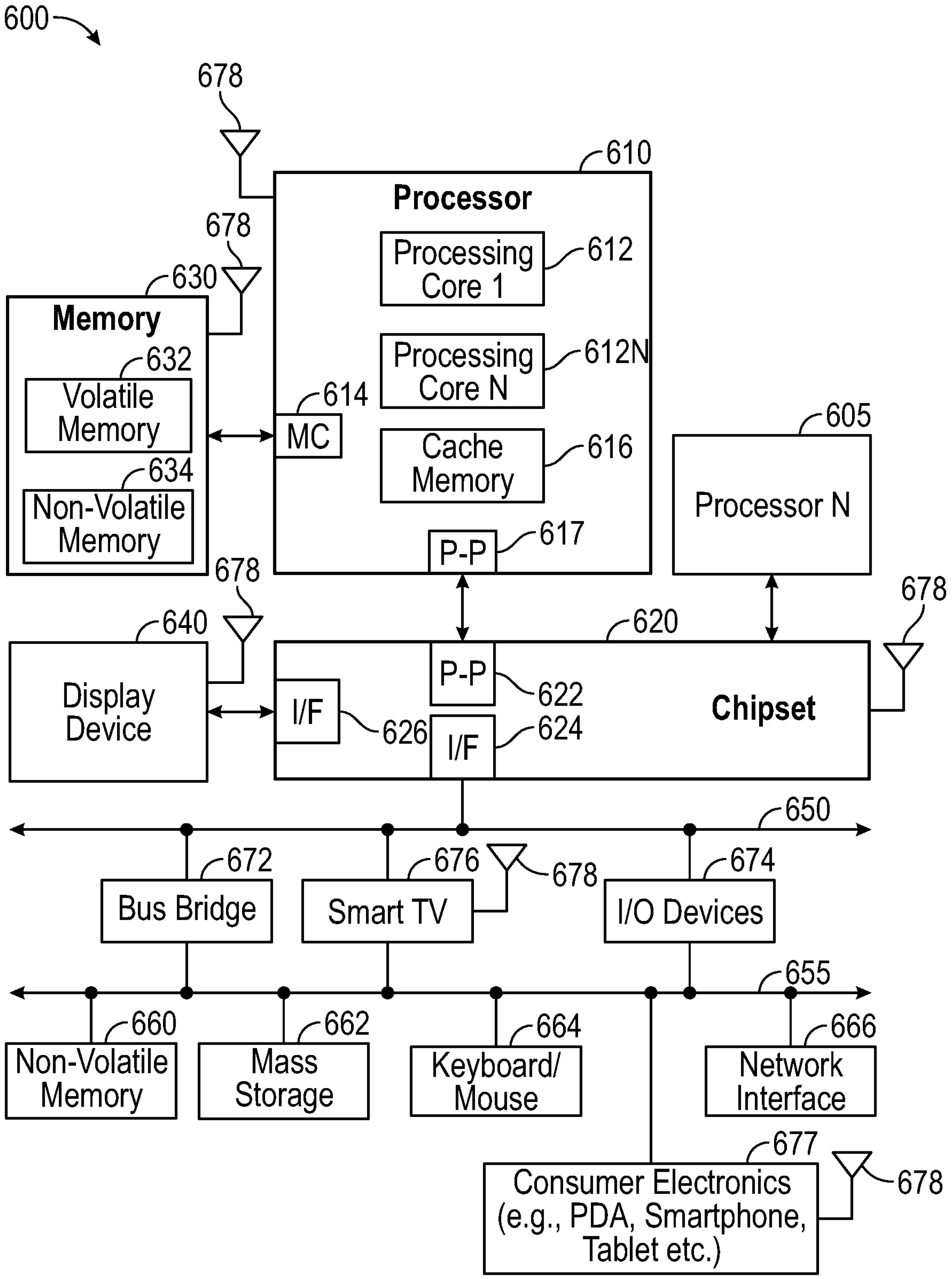
FIG. 6 shows a system that may incorporate semiconductor devices and methods, in accordance with some example embodiments.

FIG. 6 illustrates a system level diagram, depicting an example of an electronic device (e.g., system) that may include interconnects with tin and/or methods described above. In one embodiment, system 600 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 600 includes a system on a chip (SOC) system.

In one embodiment, processor 610 has one or more processor cores 612 and 612N, where 612N represents the Nth processor core inside processor 610 where N is a positive integer. In one embodiment, system 600 includes multiple processors including 610 and 605, where processor 605 has logic similar or identical to the logic of processor 610. In some embodiments, processing core 612 includes, but is not limited to, pre-fetch logic to fetch instructions, decode logic to decode the instructions, execution logic to execute instructions and the like. In some embodiments, processor 610 has a cache memory 616 to cache instructions and/or data for system 600. Cache memory 616 may be organized into a hierarchal structure including one or more levels of cache memory.

In some embodiments, processor 610 includes a memory controller 614, which is operable to perform functions that enable the processor 610 to access and communicate with memory 630 that includes a volatile memory 632 and/or a non-volatile memory 634. In some embodiments, processor 610 is coupled with memory 630 and chipset 620. Processor 610 may also be coupled to a wireless antenna 678 to communicate with any device configured to transmit and/or receive wireless signals. In one embodiment, an interface for wireless antenna 678 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 632 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 634 includes, but is not limited to, flash memory, phase change memory (PCM), read-only memory (ROM), electrically erasable programmable read-only memory (EEPROM), or any other type of non-volatile memory device.

Memory 630 stores information and instructions to be executed by processor 610. In one embodiment, memory 630 may also store temporary variables or other intermediate information while processor 610 is executing instructions. In the illustrated embodiment, chipset 620 connects with processor 610 via Point-to-Point (PtP or P-P) interfaces 617 and 622. Chipset 620 enables processor 610 to connect to other elements in system 600. In some embodiments of the example system, interfaces 617 and 622 operate in accordance with a PtP communication protocol such as the Intel® QuickPath Interconnect (QPI) or the like. In other embodiments, a different interconnect may be used.

In some embodiments, chipset 620 is operable to communicate with processor 610, 605N, display device 640, and other devices, including a bus bridge 672, a smart TV 676, I/O devices 674, nonvolatile memory 660, a storage medium (such as one or more mass storage devices) 662, a keyboard/mouse 664, a network interface 666, and various forms of consumer electronics 677 (such as a PDA, smart phone, tablet etc.), etc. In one embodiment, chipset 620 couples with these devices through an interface 624. Chipset 620 may also be coupled to a wireless antenna 678 to communicate with any device configured to transmit and/or receive wireless signals. In one example, any combination of components in a chipset may be separated by a continuous flexible shield as described in the present disclosure.

Chipset 620 connects to display device 640 via interface 626. Display 640 may be, for example, a liquid crystal display (LCD), a light emitting diode (LED) array, an organic light emitting diode (OLED) array, or any other form of visual display device. In some embodiments of the example system, processor 610 and chipset 620 are merged into a single SOC. In addition, chipset 620 connects to one or more buses 650 and 655 that interconnect various system elements, such as I/O devices 674, nonvolatile memory 660, storage medium 662, a keyboard/mouse 664, and network interface 666. Buses 650 and 655 may be interconnected together via a bus bridge 672.

In one embodiment, mass storage device 662 includes, but is not limited to, a solid state drive, a hard disk drive, a universal serial bus flash memory drive, or any other form of computer data storage medium. In one embodiment, network interface 666 is implemented by any type of well-known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 6 are depicted as separate blocks within the system 600, the functions performed by some of these blocks may be integrated within a single semiconductor circuit or may be implemented using two or more separate integrated circuits. For example, although cache memory 616 is depicted as a separate block within processor 610, cache memory 616 (or selected aspects of 616) can be incorporated into processor core 612.

To better illustrate the method and apparatuses disclosed herein, a non-limiting list of embodiments is provided here:

Example 1 includes a semiconductor device. The semiconductor device includes two or more semiconductor dies coupled to a substrate. The substrate includes a number of substrate traces and a number of first vertical connections. The semiconductor device further includes an interconnect bridge connected between the two or more semiconductor dies, the interconnect bridge. The interconnect bridge includes a number of lateral traces, a number of second vertical connections coupled between the number of lateral traces and the two or more semiconductor dies, and a layer including tin at an interface between the lateral traces and the number of second vertical connections.

Example 2 includes the semiconductor device of example 1, wherein the interconnect bridge is at least partially embedded in the substrate.

Example 3 includes the semiconductor device of any one of examples 1-2, further including one or more capacitors coupled to the substrate at the first vertical connections.

Example 4 includes the semiconductor device of any one of examples 1-3, wherein the one or more capacitors includes a die side capacitor.

Example 5 includes the semiconductor device of any one of examples 1-4, wherein the one or more capacitors includes a land side capacitor.

Example 6 includes the semiconductor device of any one of examples 1-5, further including tin at an interface between the number of substrate traces and the first vertical connections.

Example 7 includes the semiconductor device of any one of examples 1-6, further including nickel, palladium and gold at an interface between the number of substrate traces and the first vertical connections.

Example 8 includes the semiconductor device of any one of examples 1-7, further including solder at an interface between the number of second vertical connections and the two or more semiconductor dies.

Example 9 includes a semiconductor device. The semiconductor device includes two or more semiconductor dies coupled to a substrate. The substrate includes a number of substrate traces and a number of first vertical connections. The semiconductor device also includes one or more capacitors connected to the substrate through the number of first vertical connections. The semiconductor device also includes an interconnect bridge connected between the two or more semiconductor dies. The interconnect bridge includes a bridge fiducial marker, a number of lateral traces, a number of second vertical connections coupled between the number of lateral traces and the two or more semiconductor dies, and a layer including tin at an interface between the number of lateral traces and the second vertical connections.

Example 10 includes the semiconductor device of example 9, further including a substrate fiducial marker.

Example 11 includes the semiconductor device of any one of examples 9-10, wherein the bridge fiducial marker includes tin at an exposed surface.

Example 12 includes the semiconductor device of any one of examples 9-11, wherein the substrate fiducial marker includes tin at an exposed surface.

Example 13 includes the semiconductor device of any one of examples 9-12, wherein the interconnect bridge is embedded within the substrate, and a top surface of the interconnect bridge and a top surface of the substrate form a coplanar top surface.

Example 14 includes the semiconductor device of any one of examples 9-13, wherein all vertical connections in the coplanar top surface include tin at an interface below the coplanar top surface.

Example 15 includes a method of forming a semiconductor device. The method includes forming a number of openings for first level interconnects in a solder resist on a substrate to expose conductive traces in the substrate, masking at least some of the number of openings with a dry film resist to leave exposed openings, depositing one or more interface layers including tin within at least the exposed openings, and forming vertical connections over the one or more interface layers including tin.

Example 16 includes the method of example 15, wherein depositing one or more interface layers includes depositing layers including nickel, palladium and gold before depositing a tin layer.

Example 17 includes the method of any one of examples 15-16, wherein masking at least some of the number of openings includes masking to leave exposed interconnect bridge openings.

Example 18 includes the method of any one of examples 15-17, wherein forming vertical connections over the one or more interface layers includes electroplating copper vertical connections.

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the inventive subject matter has been described with reference to specific example embodiments, various modifications and changes may be made to these embodiments without departing from the broader scope of embodiments of the present disclosure. Such embodiments of the inventive subject matter may be referred to herein, individually or collectively, by the term "invention" merely for convenience and without intending to voluntarily limit the scope of this application to any single disclosure or inventive concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

As used herein, the term "or" may be construed in either an inclusive or exclusive sense. Moreover, plural instances may be provided for resources, operations, or structures described herein as a single instance. Additionally, boundaries between various resources, operations, modules, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

The foregoing description, for the purpose of explanation, has been described with reference to specific example embodiments. However, the illustrative discussions above are not intended to be exhaustive or to limit the possible example embodiments to the precise forms disclosed. Many modifications and variations are possible in view of the above teachings. The example embodiments were chosen and described in order to best explain the principles involved and their practical applications, to thereby enable others skilled in the art to best utilize the various example embodiments with various modifications as are suited to the particular use contemplated.

It will also be understood that, although the terms "first," "second," and so forth may be used herein to describe various elements, these elements should not be limited by these terms. These terms are only used to distinguish one element from another. For example, a first contact could be termed a second contact, and, similarly, a second contact could be termed a first contact, without departing from the scope of the present example embodiments. The first contact and the second contact are both contacts, but they are not the same contact.

The terminology used in the description of the example embodiments herein is for the purpose of describing particular example embodiments only and is not intended to be limiting. As used in the description of the example embodiments and the appended examples, the singular forms "a," "an," and "the" are intended to include the plural forms as well, unless the context clearly indicates otherwise. It will also be understood that the term "and/or" as used herein refers to and encompasses any and all possible combinations of one or more of the associated listed items. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

The invention claimed is:

1. A semiconductor device, comprising:

two or more semiconductor dies coupled to a substrate, the substrate including substrate traces and first vertical connections; and an interconnect bridge connected between the two or more semiconductor dies, the interconnect bridge including:

lateral traces, second vertical connections coupled between the lateral traces and the two or more semiconductor dies, and a layer including tin at an interface between the lateral traces and the second vertical connections, wherein an individual second vertical connection of the second vertical connections includes a via opening above one of the lateral traces, and a conductive material in the via opening, and wherein the layer including tin is in the via opening between the one of the lateral traces and the conductive material in the via opening.

2. The semiconductor device of claim 1, wherein the interconnect bridge is at least partially embedded in the substrate.

3. The semiconductor device of claim 1, further including one or more capacitors coupled to the substrate at the first vertical connections.

4. The semiconductor device of claim 3, wherein the one or more capacitors includes a die side capacitor.

5. The semiconductor device of claim 4, wherein the one or more capacitors includes a land side capacitor.

6. The semiconductor device of claim 1, further including tin at an interface between the substrate traces and the first vertical connections.

7. The semiconductor device of claim 1, further including one or more of nickel, palladium, and gold at an interface between the substrate traces and the first vertical connections.

8. The semiconductor device of claim 1, further including solder at an interface between the second vertical connections and the two or more semiconductor dies.

9. A semiconductor device, comprising:

a first semiconductor dies and a second semiconductor die coupled with substrate, the substrate including vertical connections;

one or more capacitors coupled with the substrate through one or more of the vertical connections; and an interconnect bridge connected between the first semiconductor dies and the second semiconductor die, the interconnect bridge including:

a bridge fiducial marker, lateral traces, conductive vias coupled between the lateral traces and the first semiconductor die and the second semiconductor die, and a layer including tin at a bottom of each of the conductive vias, between the lateral traces and one or more conductive materials of the conductive vias, wherein tin is absent from all sidewalls of the conductive vias.

10. The semiconductor device of claim 9, further including a substrate fiducial marker.

11. The semiconductor device of claim 10, wherein the bridge fiducial marker includes tin at an exposed surface.

12. The semiconductor device of claim 11, wherein the substrate fiducial marker includes tin at an exposed surface.

13. The semiconductor device of claim 9, wherein the interconnect bridge is embedded within the substrate, and a top surface of the interconnect bridge and a top surface of the substrate are coplanar.

14. The semiconductor device of claim 13, wherein all vertical connections at a surface coplanar with the top surface of the interconnect bridge include tin at an interface below the surface.

15. A process of making a semiconductor device, the process comprising:

providing two or more semiconductor dies coupled to a substrate, the substrate including substrate traces and first vertical connections; and providing an interconnect bridge connected between the two or more semiconductor dies, the interconnect bridge including:

lateral traces, second vertical connections coupled between the lateral traces and the two or more semiconductor dies, and a layer including tin at an interface between the lateral traces and the number of second vertical connections, wherein an individual second vertical connection of the second vertical connections includes a via opening above one of the lateral traces, and a conductive material in the via opening, and wherein the layer including tin is in the via opening between the one of the lateral traces and the conductive material in the via opening.

16. The process of claim 15, wherein the process further includes depositing one or more of nickel, palladium and gold between the lateral traces and the second vertical connections.

17. The process of claim 15, wherein the interconnect bridge is at least partially embedded in the substrate.

18. The process of claim 15, wherein the process further includes providing one or more capacitors coupled to the substrate at the first vertical connections.

19. The semiconductor device of claim 1, wherein:

the via opening includes a bottom and one or more sidewalls, and the layer including tin is at the bottom of the via opening.

20. The semiconductor device of claim 19, wherein tin is absent from all of the one or more sidewalls of the via opening.

* * * * *